(12) United States Patent
Freitag et al.

(10) Patent No.: US 8,266,785 B2
(45) Date of Patent: Sep. 18, 2012

(54) METHOD FOR MANUFACTURING A MAGNETORESISTIVE SENSOR HAVING A NOVEL JUNCTION STRUCTURE FOR IMPROVED TRACK WIDTH DEFINITION AND PINNED LAYER STABILITY

(75) Inventors: James Mac Freitag, San Jose, CA (US); Wipul Pemsiri Jayasekara, Los Gatos, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 929 days.

(21) Appl. No.: 11/938,690

(22) Filed: Nov. 12, 2007

(65) Prior Publication Data

US 2008/0062584 A1    Mar. 13, 2008

Related U.S. Application Data

(62) Division of application No. 11/035,771, filed on Jan. 14, 2005, now abandoned.

(51) Int. Cl.
  *G11B 5/187* (2006.01)
  *B44C 1/22* (2006.01)
(52) U.S. Cl. ............... 29/603.12; 29/603.15; 29/603.16; 29/603.18; 438/712; 438/717; 216/67; 216/94; 204/192.32; 204/192.35
(58) Field of Classification Search ............ 29/603.12, 29/603.15, 603.16, 603.18; 360/324.12; 438/712, 713, 717; 216/63, 67, 94; 204/192.32, 204/192.35
See application file for complete search history.

(56) References Cited

U.S. PATENT DOCUMENTS

| 4,436,584 | A | * | 3/1984 | Bernacki et al. | 438/713 X |
| 6,010,603 | A | * | 1/2000 | Ye et al. | 204/192.35 |
| 6,094,325 | A | * | 7/2000 | Tagawa et al. | 360/324.12 |
| 6,175,475 | B1 | | 1/2001 | Lin et al. | 360/324.11 |
| 6,411,478 | B1 | | 6/2002 | Mao et al. | 360/324.2 |
| 6,542,342 | B1 | | 4/2003 | Hayashi et al. | 360/324.2 |
| 7,023,670 | B2 | | 4/2006 | Saito | 360/324.12 |

(Continued)

FOREIGN PATENT DOCUMENTS

JP        05342527 A    * 12/1993

OTHER PUBLICATIONS

Office Action Summary from U.S. Appl. No. 11/035,771 mailed on Mar. 29, 2007.

(Continued)

*Primary Examiner* — A. Dexter Tugbang
(74) *Attorney, Agent, or Firm* — Zilka-Kotab, PC

(57) ABSTRACT

A method for manufacturing a magnetoresistive sensor having improved pinned layer stability at small track widths. The method includes providing a substrate, and depositing a plurality of sensor layers. A layer of material that is resistant to removal by chemical mechanical polishing (CMP stop layer) and an antireflective coating layer are deposited. A photoresist mask is formed on the antireflective layer, and a reactive ion etch (RIE) is performed to remove portions of the ion mill resistant mask that are not covered by the photoresist mask, the RIE being performed in a plasma chamber having a platen, the performing the RIE further comprising applying a platen power of at least 70 W. An ion milling is performed to remove a portion of the sensor layers, the ion milling being terminating before all of the sensor materials have been removed.

9 Claims, 11 Drawing Sheets

U.S. PATENT DOCUMENTS

| | | | |
|---|---|---|---|
| 7,199,984 B2 | 4/2007 | Carey et al. | 360/324.12 |
| 2003/0179500 A1 | 9/2003 | Gill et al. | 360/240 |
| 2004/0109265 A1* | 6/2004 | Gill | 360/324.12 |
| 2006/0181813 A1 | 8/2006 | Fukuzumi | 360/324 |

OTHER PUBLICATIONS

Office Action Summary from U.S. Appl. No. 11/035,771 mailed on Jun. 29, 2007.

Final Office Action Summary from U.S. Appl. No. 11/035,771 mailed on Oct. 9, 2007.

Advisory Action Summary from U.S. Appl. No. 11/035,771 mailed on Jan. 17, 2008.

Examiners Answer from U.S. Appl. No. 11/035,771 mailed on Jun. 18, 2008.

Decision on Appeal from U.S. Appl. No. 11/035,771 mailed on Jan. 22, 2010.

* cited by examiner

METHOD FOR MANUFACTURING A MAGNETORESISTIVE SENSOR HAVING A NOVEL JUNCTION STRUCTURE FOR IMPROVED TRACK WIDTH DEFINITION AND PINNED LAYER STABILITY

RELATED APPLICATIONS

This application is a Divisional Application of U.S. patent application Ser. No. 11/035,771 entitled MAGNETORESISTIVE SENSOR HAVING A NOVEL JUNCTION STRUCTURE FOR IMPROVED TRACK WIDTH DEFINITION AND PINNED LAYER STABILITY, filed on Jan. 14, 2005, now abandoned which is incorporated by reference as if fully set forth herein.

FIELD OF THE INVENTION

The present invention relates to the manufacture of magnetoresistive sensors and more particularly to a method for accurately defining the side walls and track width of a magnetoresistive sensor and for improving pinned layer stability through use of a novel pinned layer structure.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, a thin layer of air develops between the slider and the rotating disk. When the slider rides on this air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

Traditionally, GMR sensors have been constructed as current in plane (CIP) GMR sensors, wherein current flows through the sensor from one side to the other in a direction parallel with the planes of the layers making up the sensor. More recently, increased attention has been focused on current perpendicular to plane (CPP) GMR sensors. As its name suggests, in a CPP sensor, current flows through the sensor from top to bottom in a direction perpendicular to the planes of the layers making up the sensor.

Another type of magnetoresistive sensor is a tunnel junction sensor (TMR) or tunnel valve. A tunnel valve includes a pinned layer and a free layer, similar to a GMR sensor. However, instead of having a non-magnetic electrically conductive spacer layer between the free and pinned layers, a tunnel valve has a thin dielectric, non-magnetic barrier layer, which can be constructed of for example alumina $Al_2O_3$. A tunnel valve operates based on the spin dependent scattering of electrons through the thin barrier layer. When the magnetic moments of the free and the pinned layer are aligned parallel with one another, electrons much more readily pass through the barrier layer than when they are the moments are antiparallel. Therefore, current travels through a tunnel valve in a direction perpendicular to the plane of the layers making up the sensor, similar to a current perpendicular to plane (CPP) GMR.

With reference to FIG. 1A, magnetoresistive sensors have been constructed by a method that includes first depositing the sensor layers 102 as full film layers, on a substrate 104, which can be for example an alumina gap layer, or in the case of a CPP GMR or tunnel valve could be an electrically conductive magnetic material such as NiFe. Then, a full film layer of material that is resistant to chemical mechanical polishing (CMP stop) such as diamond like carbon (DLC) 106 is deposited. A layer 108 of a antireflective coating material (ARC), such as Duramide, is then deposited over the CMP resistant material 106. A mask 110 that includes one or more layers of a photoreactive material such as photoresist is then formed to cover the area where the sensor is desired and exposing other portions.

With continued reference to FIG. 1A, a reactive ion etch 112 is then performed to remove portions of the ARC layer 108 and CMP stop 106 that are not covered by the photoresist mask 110. This process is known in the industry as transferring the image of the photoresist mask 110 onto the underlying mask layers 106, 108. The RIE process used to transfer the image of the photoresist mask onto the underlying layers 106, 108 is chosen to be a RIE process that can readily remove the materials making up the underlying layers 106, 108.

With reference now to FIG. 1B, it can be seen that, since the RIE process used to perform the image transfer preferentially removes the layer 108 at a faster rate than it removes the photoresist layer 110, a bulbous or mushroom shape forms on the mask layers 106, 108, 110.

After the image transfer process has been performed, another material removal process 113, such as ion milling, can be used to remove sensor material, thereby defining the sensor. The ions that remove the sensor material during the ion mill 113 travel in a direction that is mostly normal to the planes of the sensor layers. However, not all of the ions travel in a direction that is perfectly normal to the planes of the sensor. A portion of the ions travel at angles up to plus or minus about 5 degrees. This results in an uneven material removal rate near the mask. The amount of sensor material removed decreases gradually toward the sensor, resulting in a downwardly sloping structure outside of the active area of the sensor. This downward slope is the result of the uneven distribution of ions being angled toward the sensor and able to pass under the overhanging mask structure.

Sensor performance depends, to large extent on the clean and precise definition of the sensor by the ion mill process. For example, the trackwidth of the sensor is determined by this ion milling procedure, so accurate location of the side walls is critical. In addition, accurate definition of the trackwidth depends upon having a sharp sensor edge that is as close to vertical as possible. A sloping sensor side wall results in a poorly defined trackwidth. Furthermore, a clean vertical side wall is necessary for efficient free layer biasing, since the hard bias layers will abut this side wall.

Unfortunately, the bulbous mask structure 110 prevents the clean accurate sensor definition. For example, the bulbous mask 110 results in shadowing during the ion mill process 113. In addition, the bulbous mask shape results in non-uniform deposition of layers such as hard bias layers and lead layers.

The above described construction has been called a CMP lift of process. This is because after forming the sensor, layers of material such as hard magnetic bias material, lead material, and a second layer of CMP resistant material such as DLC are deposited over the sensor and mask, completely covering the mask and filling the areas outside of the sensor area. Since the mask structure is completely covered, a chemical lift off cannot be performed to remove the mask structure. Therefore, a chemical mechanical polish (CMP) is performed to remove the mask structure 108, 110 and the layers covering it. The second layer of CMP resistant material defines the termination of the CMP process and the first layer of CMP resistant material 106 protects the sensor from damage during the CMP.

Another method of constructing a sensor involves the use of a bi-layer mask structure (not shown), the bi-layer includes a purposely formed overhang that allows chemical lift off of the mask structure without the use of CMP. The overhang allows mask liftoff chemicals to enter under the overhanging portion of mask to contact the mask unimpeded by the overlying bias, lead and CMP resistant. Although the use of a bi-layer resist allows removal of the mask without the need for CMP, it can be appreciated that the relatively large overhanging mask structure presents even greater challenges to accurate sensor definition than does the previously described CMP liftoff process, for the similar reason that the overhanging portion of the mask structure allows only a portion of the ions to pass under the overhang during the ion milling operation used to define the sensor.

The push for ever increased data capacity and data rate forces engineers and scientists to find ways to make magnetoresistive sensors ever smaller. For example by decreasing the width of the sensor the trackwidth of the recording system can be decreased allowing more tracks of data to be recorded on a recording medium. Unfortunately, as the size of the sensor decreases, the magnetic characteristics of the layers making up the sensor behave less like well defined thin film structures and become unstable. This is especially problematic with regard to the pinned layer structure. As the track width of the sensor shrinks, the pinned layer becomes less stable. As a result the magnetic moment of the pinned layer is prone to switching direction (amplitude flipping). Such amplitude flipping is a catastrophic event that renders the sensor unusable. This amplitude flipping can easily occur during an event such as an electrostatic discharge (ESD) or during a head disk contact, both of which momentarily increase the temperature of the sensor.

Therefore, there is a strong felt need for a method for defining the track width of a magnetoresistive sensor that overcomes the shadowing problems resulting from the bulbous mask structure described above. In addition, there is a strong felt need for a method for overcoming pinned layer instability problems resulting from decreased trackwidth.

SUMMARY OF THE INVENTION

The present invention provides method for manufacturing a magnetoresistive sensor having a track width defined by straight, substantially vertical side walls. The sensor is formed by depositing a plurality of sensor layers over a substrate, then depositing a CMP stop layer, and a antireflective coating layer over the sensor layer. A photoreactive layer is then photolithographically patterned to form a mask. A reactive ion etching process is then performed to transfer the image of the mask onto the underlying antireflective layer and CMP stop layer. The reactive ion etching is performed using a platen power of at least 70 W. An ion mill is then performed to remove a portion of the sensor layers and is terminated before all of the sensor layers have been removed.

The free layer terminates at the substantially vertical side wall, but all or a portion of the pinned layer structure extends significantly beyond the substantially vertical side walls. The extended pinned layer structure allows the sensor to posses a strong resistance to amplitude flipping while also allowing the sensor to have a very small, well defined track width.

The laterally extending portions of the free layer do not taper. They have upper surfaces, that define planes that are parallel or nearly so with a plane defined by the other sensor layers. The upper surfaces of the extended portions of the pinned layer structure may be parallel with the free layer within plus or minus 30 degrees.

The pinned layer structure can meet the substantially vertical side walls at a junction that is sharp and that forms a substantially 90 degree angle.

Rather than having the entire pinned layer structure extending beyond the track width region of the sensor, the sensor may be configured so that only a portion of the pinned layer structure extends beyond the track width. Alternatively, the pinned layer may terminate at the substantially vertical side walls, but the sensor may include an AFM layer that extends beyond the track width.

The straight, vertical side walls and non-tapered extended pinned layer are made possible by a method of manufacture that avoids shadowing during ion milling. This method may include the formation of a tapered or dome shaped mask with no overhang or bulbous, mushroom portion. By eliminating shadowing effects, an ion mill may be performed to remove sensor material at substantially uniform rate, thereby avoiding tapering at the extended portion of the sensor.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1A:
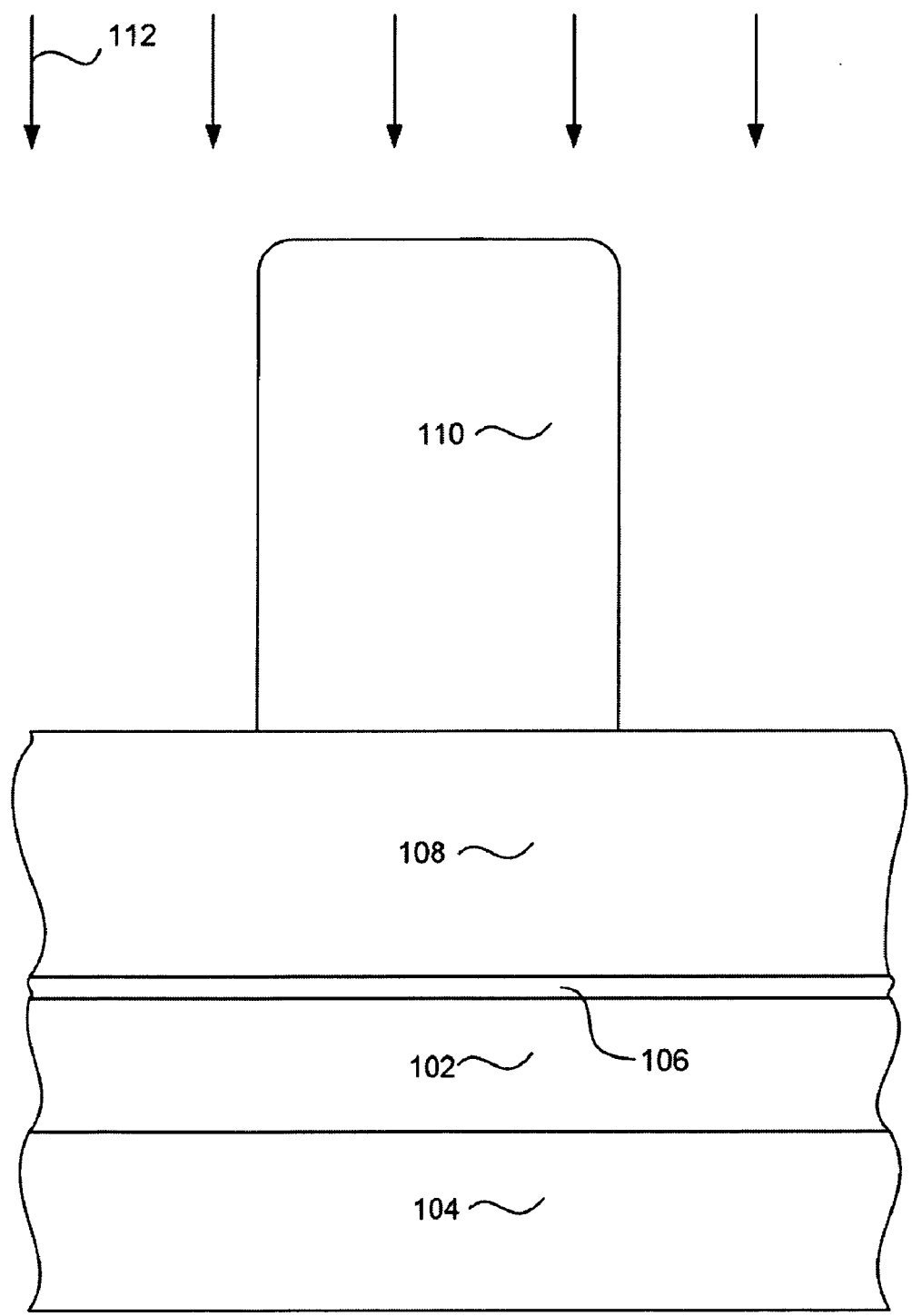
FIGS. 1A and 1B are ABS views illustrating a prior method of constructing a magnetoresistive sensor.
Figure 1B:
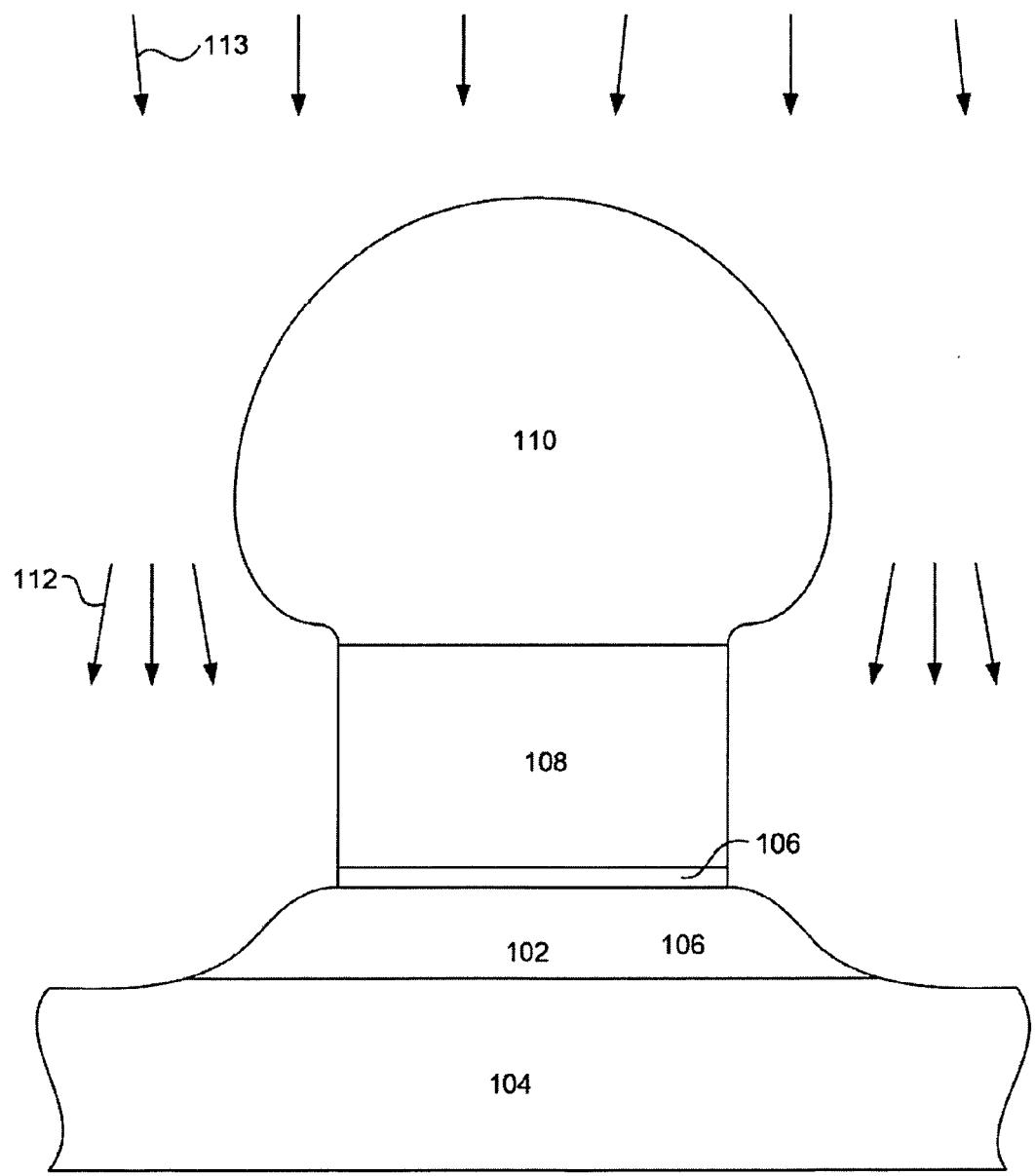
Figure 2:
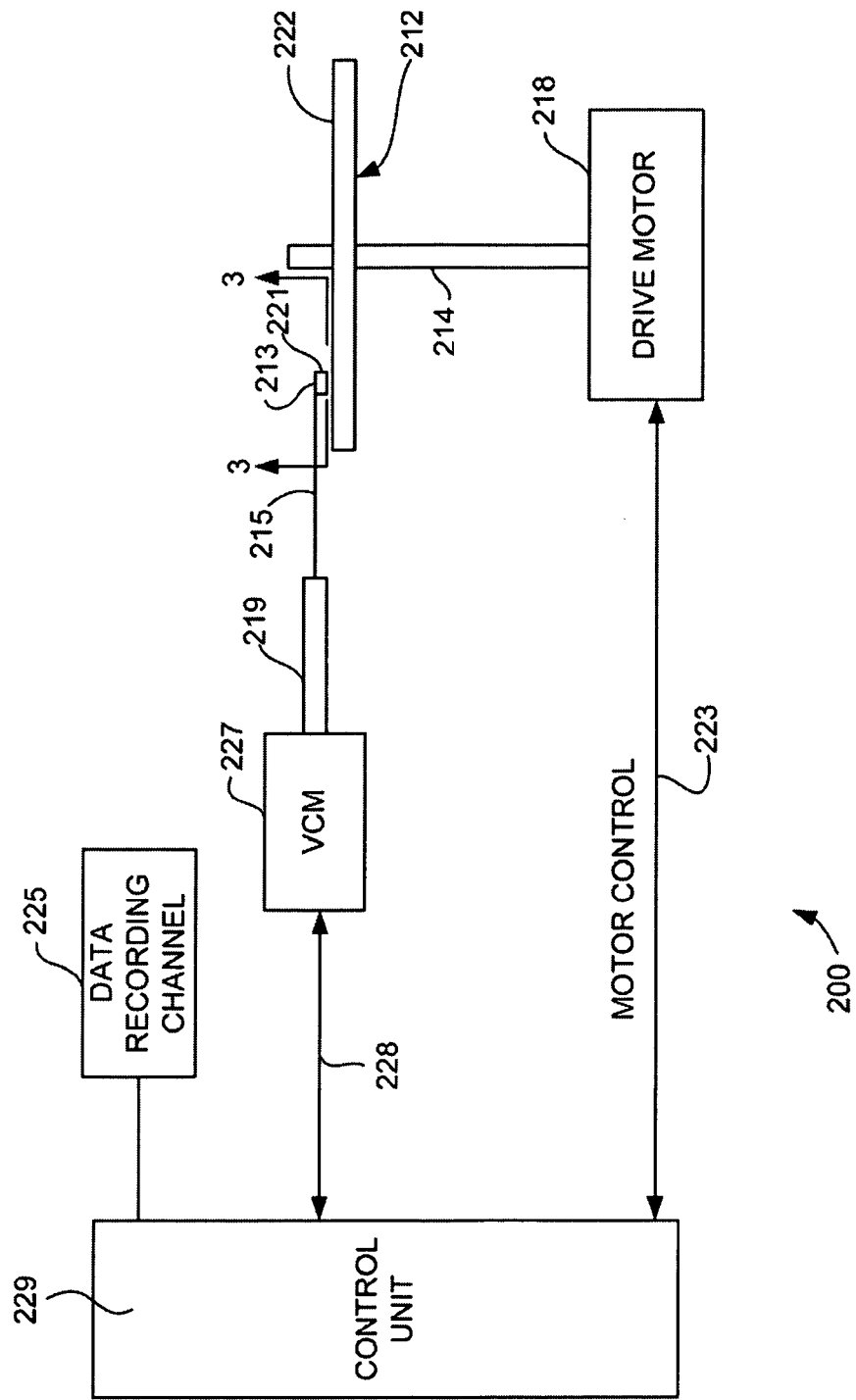
FIG. 2 is a schematic illustration of a disk drive system in which the invention might be embodied.

Referring now to FIG. 2, there is shown a disk drive 200 embodying this invention. As shown in FIG. 2, at least one rotatable magnetic disk 212 is supported on a spindle 214 and rotated by a disk drive motor 218. The magnetic recording on each disk is in the form of annular patterns of concentric data tracks (not shown) on the magnetic disk 212.

At least one slider 213 is positioned near the magnetic disk 212, each slider 213 supporting one or more magnetic head assemblies 221. As the magnetic disk rotates, the slider 213 moves radially in and out over the disk surface 222 so that the magnetic head assembly 221 may access different tracks of the magnetic disk where desired data are written. Each slider 213 is attached to an actuator arm 219 by way of a suspension 215. The suspension 215 provides a slight spring force which biases slider 213 against the disk surface 222. Each actuator arm 219 is attached to an actuator means 227. The actuator means 227 as shown in FIG. 2 may be a voice coil motor (VCM). The VCM comprises a coil movable within a fixed magnetic field, the direction and speed of the coil movements being controlled by the motor current signals supplied by controller 229.

During operation of the disk storage system, the rotation of the magnetic disk 212 generates an air bearing between the slider 213 and the disk surface 222 which exerts an upward force or lift on the slider. The air bearing thus counter-balances the slight spring force of suspension 215 and supports slider 213 off and slightly above the disk surface by a small, substantially constant spacing during normal operation.

The various components of the disk storage system are controlled in operation by control signals generated by control unit 229, such as access control signals and internal clock signals. Typically, the control unit 229 comprises logic control circuits, storage means and a microprocessor. The control unit 229 generates control signals to control various system operations such as drive motor control signals on line 223 and head position and seek control signals on line 228. The control signals on line 228 provide the desired current profiles to optimally move and position slider 213 to the desired data track on disk 212. Write and read signals are communicated to and from write and read heads 221 by way of recording channel 225.

Figure 3:
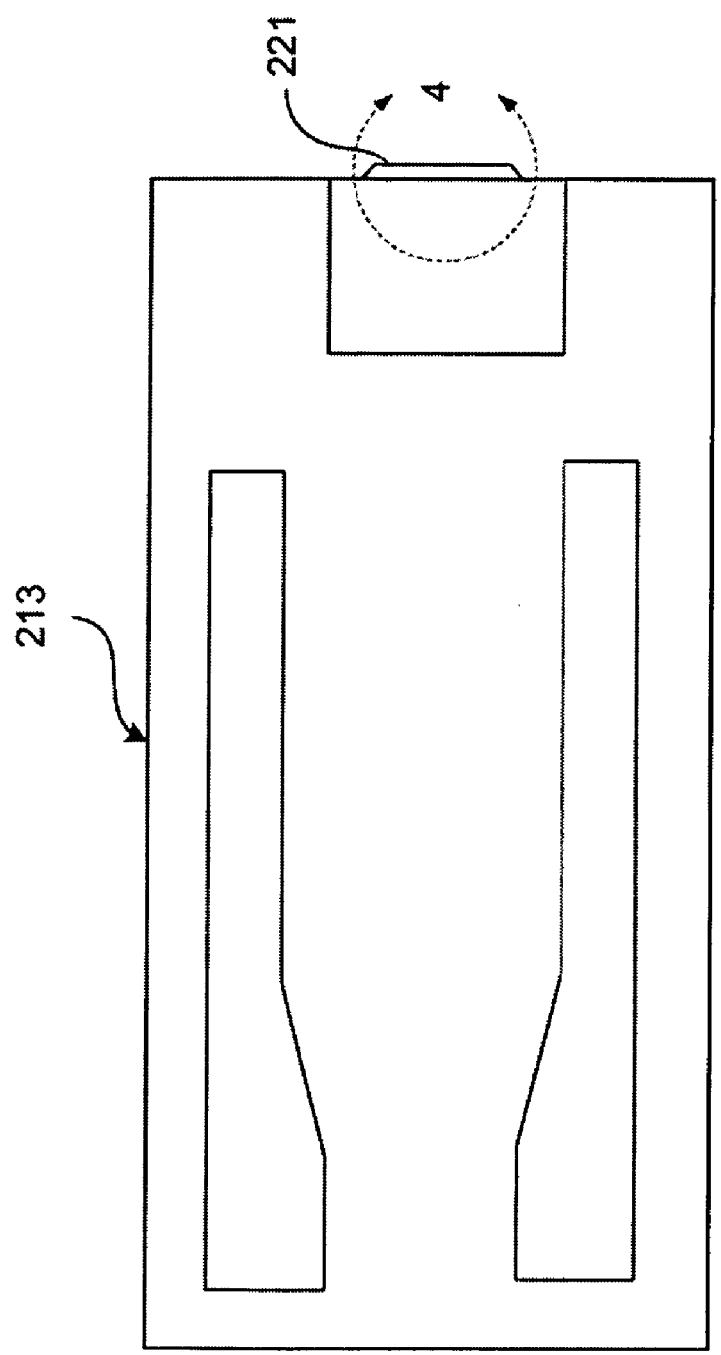
FIG. 3 is an ABS view of a slider illustrating the location of a magnetic head thereon.

With reference to FIG. 3, the orientation of the magnetic head 221 in a slider 213 can be seen in more detail. FIG. 3 is an ABS view of the slider 213, and as can be seen the magnetic head including an inductive write head and a read sensor, is located at a trailing edge of the slider. The above description of a typical magnetic disk storage system, and the accompanying illustration of FIG. 2 are for representation purposes only. It should be apparent that disk storage systems may contain a large number of disks and actuators, and each actuator may support a number of sliders.

Figure 4:
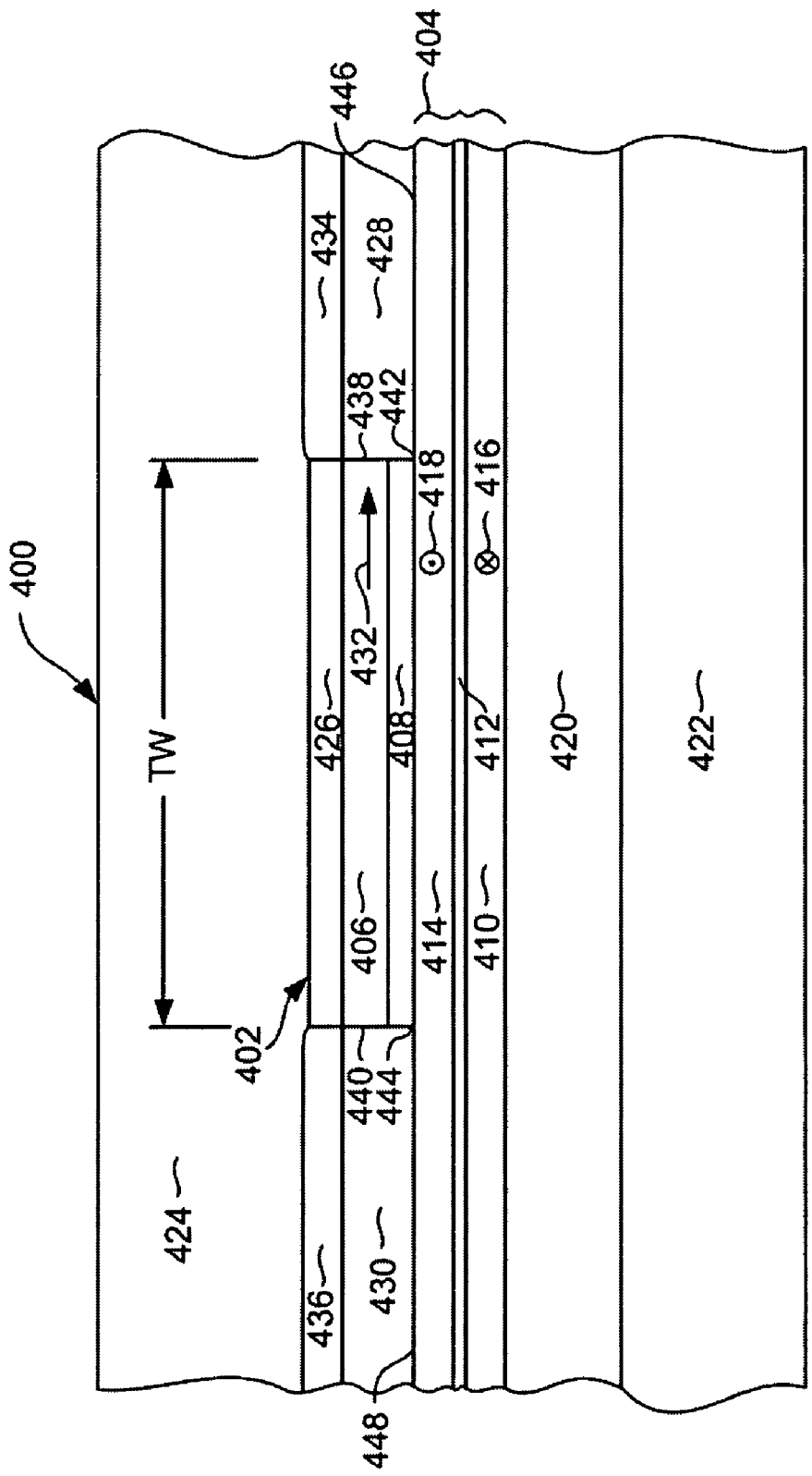
FIG. 4 is an ABS view of a magnetic sensor according to an embodiment of the present invention taken from circle 3 of FIG. 2 and rotated 90 degrees counterclockwise.

With reference now to FIG. 4, a magnetoresistive sensor 400 according to an embodiment of the invention includes a sensor stack 402. The sensor stack includes a magnetically pinned layer 404, a magnetically free layer 406 and a non-magnetic, electrically conductive spacer layer 408, such as Cu, sandwiched there between. It should be pointed out that although the sensor is being described in terms of a GMR sensor, it could also be a tunnel valve (TMR) sensor, in which case the spacer layer 408 would be a non-magnetic, electrically insulating material such as alumina ($Al_2O_3$).

The pinned layer 404, may be one of several types of pinned layers, such as a simple pinned, AP pinned, self pinned or AFM pinned sensor. For purposes of simplicity, the sensor will be described herein as an AP pinned, AFM pinned sensor having an AP1 layer 410, AP2 layer 414, and a non-magnetic, AP coupling layer, such as Ru 412 sandwiched there between. The AP1 and AP2 layers 410, 414 can be constructed of several magnetic materials such as, for example NiFe or CoFe, and have magnetic moments 416, 418 that are pinned by exchange coupling of the AP1 layer 410 with a layer of antiferromagnetic material (AFM layer) 420 such as PtMn.

The sensor stack 402 is sandwiched between first and second non-magnetic, electrically insulating gap layers 422, 424, and may include a cap layer 426, such as Ta, to protect the sensor stack 402 from damage during manufacturing. First and second hard bias layers 428, 430 extend laterally from the sides of the sensor and magnetostatically couple with the free layer 406 to bias the magnetic moment 432 of the free layer in a desired direction parallel with the ABS. First and second electrically conductive leads 434, 436 are provided above the hard bias layers to provide a sense current to the sensor 400.

As can be seen with reference to FIG. 4, portions of the sensor stack 402 terminate at vertical or nearly vertical side walls 438, 440 that define the track width (TW) of the sensor 400. The pinned layer 404 and AFM layer 420 extend laterally outward well beyond the track width TW of the sensor. In fact the pinned layer 404 and AFM layer 420 preferably extend well into the field region and can extend as far as the leads 434, 436 and hard bias layers 428, 430 extend. At any rate, the pinned layer 404 should extend laterally outside of the active area of the sensor at either side by a distance that is at least equal to the track width TW. In other words, the pinned layer 404 should have a lateral width of at least 3 TW.

The sides 438, 440 are preferably normal to the planes of the sensor layers (vertical as shown in FIG. 4), but may define an angle of up to about 5 degrees with respect to the normal to the sensor layers 404, 406, 408, 426. Furthermore, the walls 438, 440 and the AP2 layer 436 meet at sharp junctions 442, 444 that form an angle of 90 degrees or nearly so. Although the angle defined by the junctions 442, 444 is preferably 90 it may be 90 degrees plus or minus about 20 degrees or more preferably plus or minus about 5 degrees. Also, as can be seen with reference to FIG. 4, each of the laterally extending portions of the sensor stack 402, in this case the AP2 layer, has an upper surface 446, 448 that is essentially coplanar with the surfaces of the other sensor layers. In other words, the upper surfaces 446, 448 do not taper downward, but extend straight out, so that the laterally extending portions of the pinned layer 404 do not become substantially thinner as they extend outward. Although, the surfaces 446, 448 are preferably flat and coplanar with the other sensor layers, they may taper a negligible amount, not greater than 30 degrees (more preferably 5 degrees) with respect to the horizontal (ie. with respect to the other planes defined by the surfaces of the other layers of the sensor stack 402). This generally non-tapered structure of the laterally extending portions of the pinned layer 404 as well as the sharp junctions 442, 444 and generally straight vertical side walls 438, 440 are made possible by a novel manufacturing process that will be described below.

Figure 5:
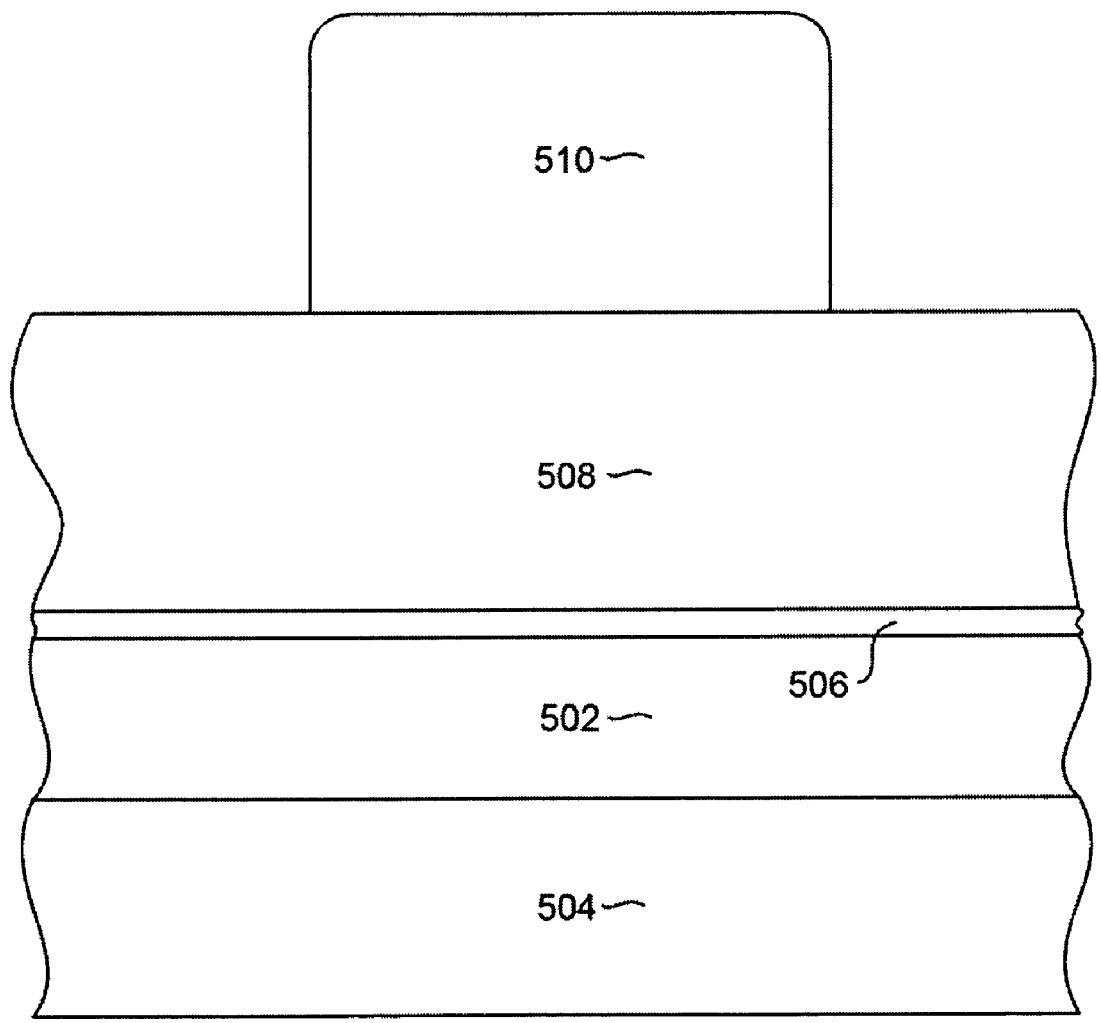
FIGS. 5-9 are ABS views of a magnetoresistive sensor in various intermediate stages of manufacture.
Figure 6:
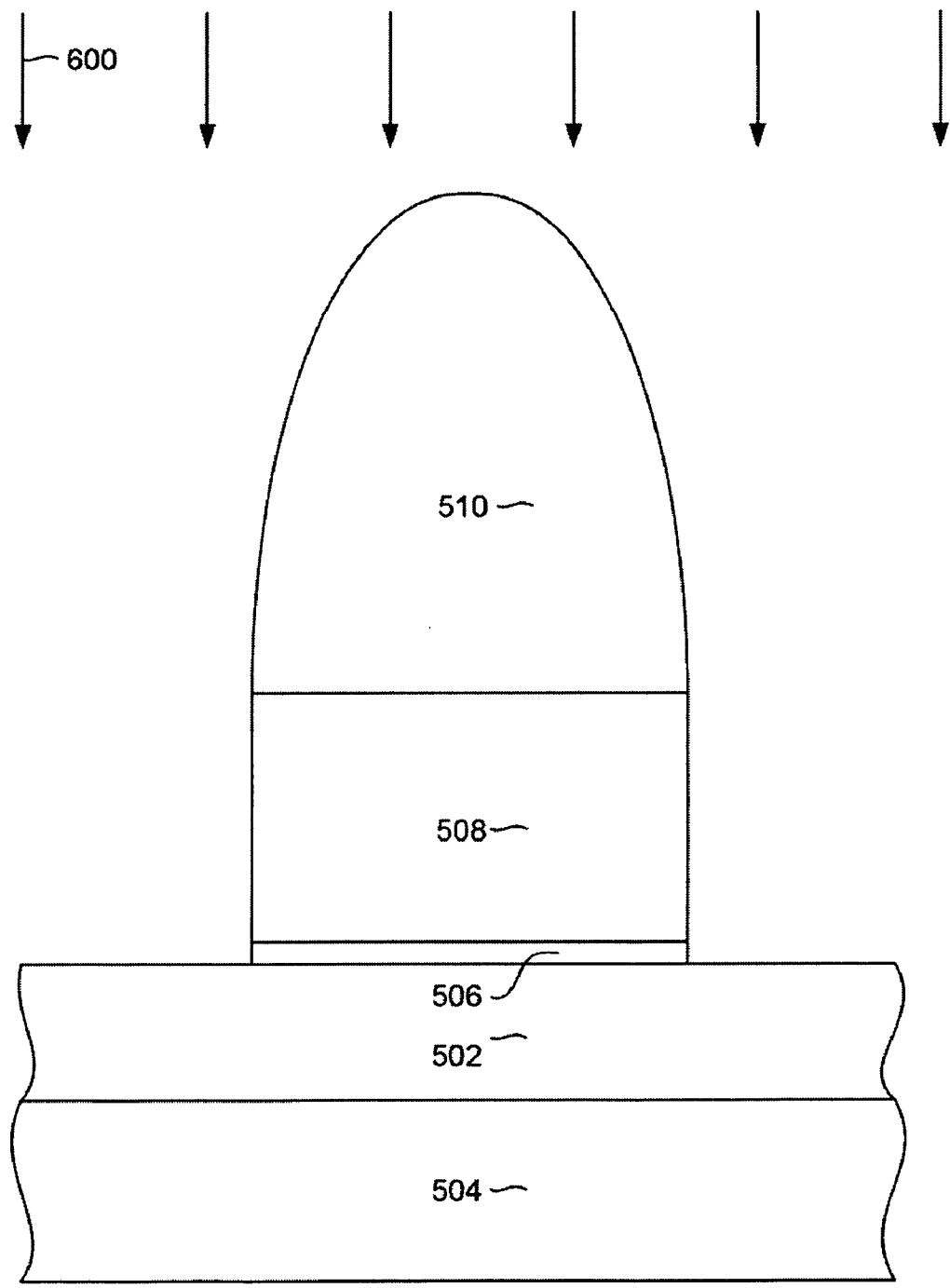
Figure 7:
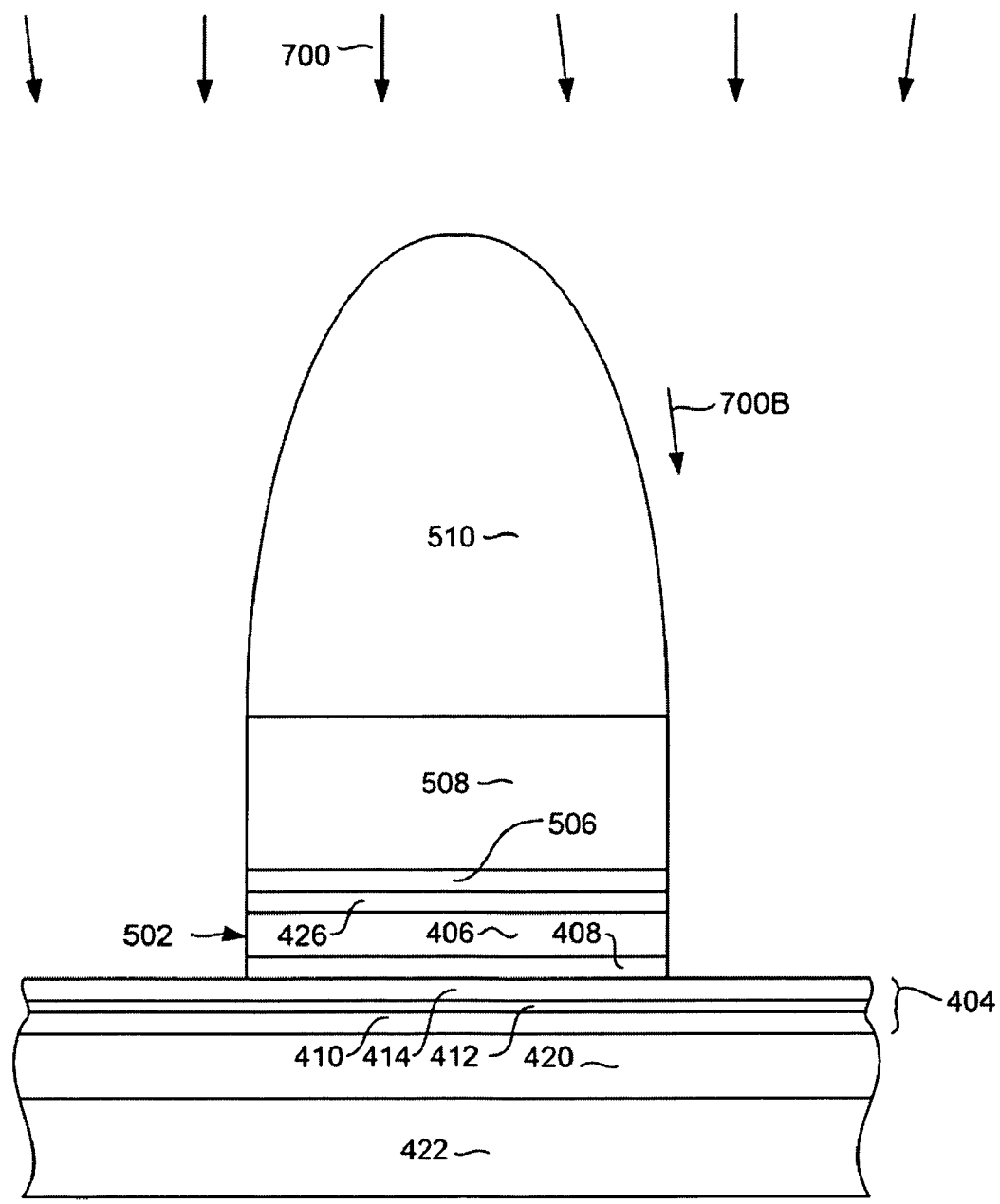

With reference now to FIGS. 5-7, a method for manufacturing the sensor 400 will be described. More particularly, the method is for defining the width and stripe height of the sensor and defines the sensor with desired clean, vertical, well defined side walls 438,440, sharp junctions 442, 444 and a generally non-tapered extended pinned layer 404. With particular reference to FIG. 5, a series of sensor layers 502 are deposited on a substrate 504, such as a non-magnetic, electrically insulating gap layer 504. The sensor layers 502 include full film layers of material that will make up the AFM 420, pinned layer 404 spacer 408, free layer 406 and cap layer 426, previously described with reference to FIG. 4. Other layers may be included as well.

With reference to FIG. 5, a layer of material that is resistant to chemical mechanical polishing (CMP stop layer) 506 may be deposited on the sensor layers. The CMP stop layer 506 may be, for example, diamond like carbon (DLC) or some other material. Then, a layer of antireflective coating (ARC) material 508 is deposited. The ACR layer 508 may be an ion mill resistant material such as Duramide. The layer 508 can also be for example, hard baked photoresist. Then, a layer of photoreactive material or TIS such as photoresist 510 is spun onto the layer 510 and is photolithographically patterned to form a sensor mask 510. The mask 510 covers an area that will become the sensor stack 502 (FIG. 4), and leaves other areas uncovered.

With reference now to FIG. 6 a reactive ion etch (RIE) 600 is performed to transfer pattern of the mask onto the underlying layers 508, 506. REI processes include both a chemical component and a mechanical or physical component to their total material removal performance. A RIE process is performed in a plasma chamber in an atmosphere that may contain a gas such as Ar or $O_2$, preferably $O_2$. Power is applied to the gas to strike a plasma in the chamber and a bias voltage is applied to a chuck holding the workpiece, in order to bias ions toward the workpiece. Bombardment of ions against the workpiece results in the removal of material from the workpiece. The strength of this ion bombardment determines the physical component of the material removal. A chemical reaction of the plasma or other gasses in the chamber causes a chemical component of the material removal.

For purposes of the present invention, the RIE 600 is performed in a chamber with an $O_2$ gas plasma. As discussed in the Background of the Invention, prior art RIE processes have removed the mill resistant layer 508 at a faster rate than the photoresist mask 510. We have found that this is because the chemical component of the material removal preferentially attacks the mill resistant layer 508 more readily than the photoresist layer 510. According to the present invention, the RIE 600 is performed with an increased physical component to increase the ratio of removal of photoresist 510 relative to the removal of ARC 508.

An increase in the physical component of material removal can be achieved by increasing the bias voltage applied to the chuck on which the workpiece is held within the plasma chamber. This increased bias voltage causes the ions within the plasma to strike the workpiece with increased speed and, therefore, increased energy. This bias voltage is determined by the platen power. The platen power is preferably at least 70 W and may be about from 70 W to 500 W. The platen power is more preferably 250 W to 350 W, or about 300 W.

The image transfer using the RIE process at the power settings described above results in the photoresist mask 510 having a conical shape as shown in FIG. 6, without any overhang or mushroom shape to the photoresist layer 510. This advantageously prevents shadowing during an ion mill process described below.

With reference now to FIG. 7, to define the sensor, a material removal process 700, which is preferably an ion milling process, is used to remove portions of the sensor layer 502. The ion mill process 700 terminates at some point within the level of the sensor layers 502. To construct a sensor 402 according to the above described embodiment, the ion milling 700 is terminated when the spacer layer 408 has been reached. The point at which to terminate the ion milling process 700 can be determined by Cu detection which indicates that the spacer 408 has been reached. In this way the ion milling can remove the free layer 406 and at least a portion of the spacer layer 408 while leaving the pinned layer 404 extending as a full film layer. Such termination of the ion milling operation within the sensor layers 502 can be called a partial mill process. The ion milling operation removes most or all of the photoresist mask 510, leaving the ARC layer mask 508 and CMP stop layer 506 relatively intact. Because of the conical shape of the mask 510 all of the exposed portions experience the same ion bombardment during the ion milling process 700. Even ions directed slightly away from the active area of the sensor, as indicated by arrow 700B will be able to strike areas the sensor layers at areas just adjacent to the mask 508

Figure 8:
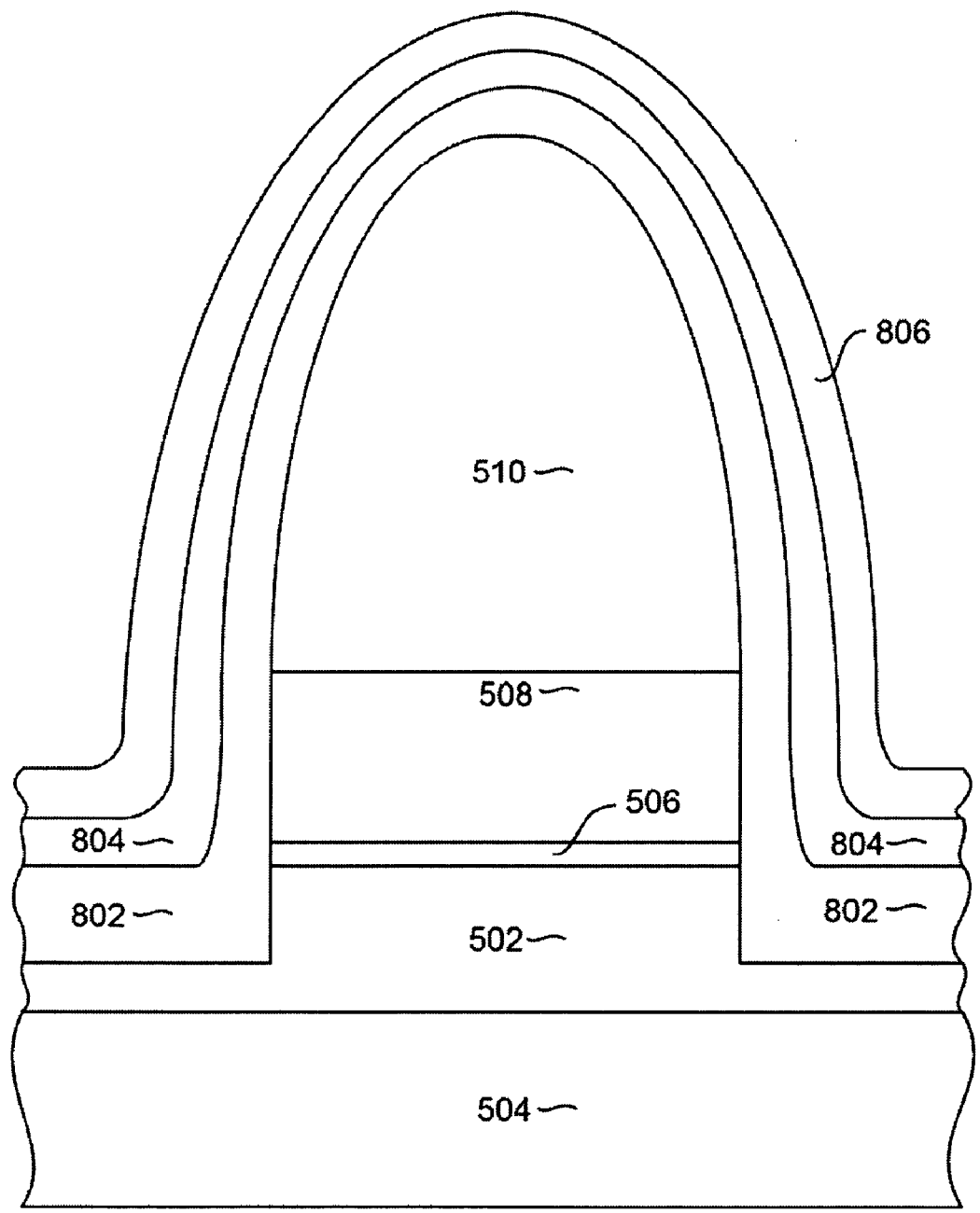

With reference to FIG. 8, a layer of hard magnetic material 802 may be deposited full film to provide the hard bias layers 428, 430 (FIG. 4) in the finished sensor 400. One or more seed layers (not shown) may be deposited before depositing the hard magnetic material. The hard magnetic material 802, may be, for example, CoPtCr, or some other magnetic material having a high coercivity (Hc).

Figure 9:
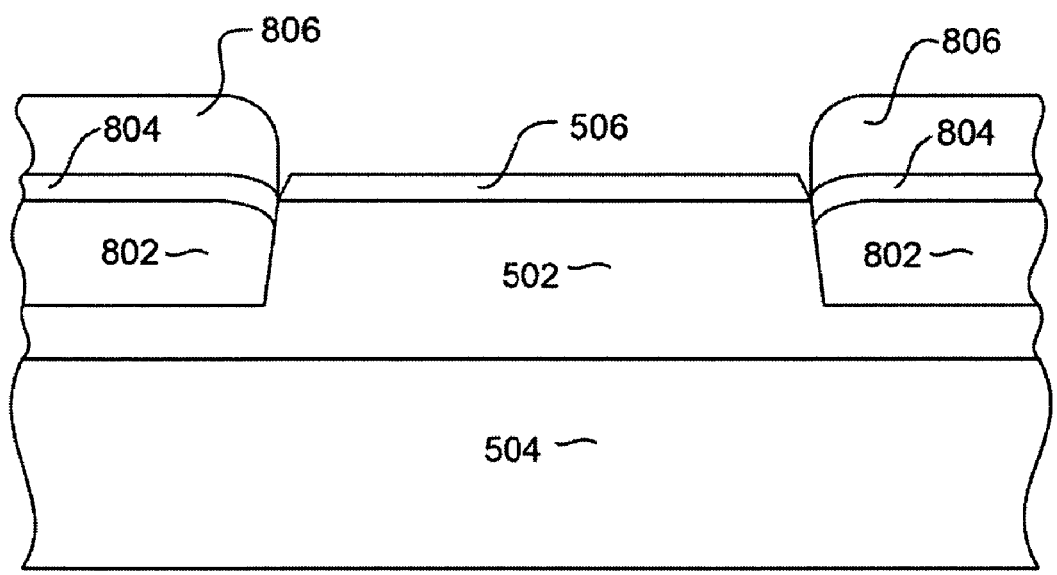

After the hard magnetic material 802 has been deposited, a layer of electrically conductive material 804, such as Cu, Au, Rh or Ta is deposited to provide material for the leads 434, 436 (FIG. 4). A second CMP resistant layer 806 is then deposited. Thereafter, with reference to FIG. 9, a chemical mechanical polishing process (CMP) may be performed, to remove the portions of the layers 802, 804, 806 that extend upward over the masks structures 508, 510 and to remove the mask structures 508, 510 themselves. The CMP resistant layer 806 prevents the CMP process from removing portions of the lead material 804 extending outside of the active area of the sensor and provides an indicator to the operator as to when to terminate the CMP process. The first CMP stop layer 506 prevents damage to the sensor layers 502 during the CMP process. Another RIE process may optionally be performed to remove the remaining CMP resistant material 806. Thereafter, a layer of non-magnetic, electrically insulating material, such as alumina may be deposited to form the second gap layer 424 (FIG. 4).

By terminating the ion mill process 700 (FIG. 7) before removal of the pinned layer structure 404, a very large pinned layer structure can be formed. This allows the pinned layer to remain very magnetically stable, avoiding amplitude flipping. The pinned layer can remain large and stable even though the sensor has a very small track width as defined by the width of the free layer 406. This overcomes the amplitude flipping problems associated with prior art sensor, while allowing the sensor to have a desired small track width.

The above described method of manufacture makes this extended pinned layer structure possible by avoiding shadowing during ion milling. By avoiding shadowing, the sensor material can be removed at a uniform rate, thereby allowing the extended portion of the pinned layer 404 to extend laterally outward without tapering. Without the use of the above described method of manufacturing the sensor, by the time the ion milling 700 reached the spacer layer 408 at in edge of the track width, or active area of the sensor, the pinned layer 404 would be completely removed not far outside of the active area.

It should be pointed out that the above described embodiment having the entire pinned layer extending laterally outward is only by way of example. In another embodiment (not shown), a portion of the pinned layer, such as the AP2 layer 414 could be removed and the AP1 layer 410 could be left intact to extend laterally beyond the active area of the sensor. This embodiment could be formed by terminating the ion mill 700 when the Ru spacer 412 is reached.

In still another possible embodiment of the invention, the ion mill could be performed sufficiently to remove all of the pinned layer 404 that extends beyond the active area of the sensor, leaving the AFM layer 420 to extend beyond the active area of the sensor. Each of the above described embodiments provides increased pinned layer stability and avoids amplitude flipping.

Also, while the present invention has been described in terms of an AP coupled AFM pinned layer structure, it should be pointed out that the present invention could also be used in a sensor having a simple pinned layer or in a sensor having a self pinned layer (ie. pinned by magnetostriction) rather than an AFM pinned layer.

Figure 10:
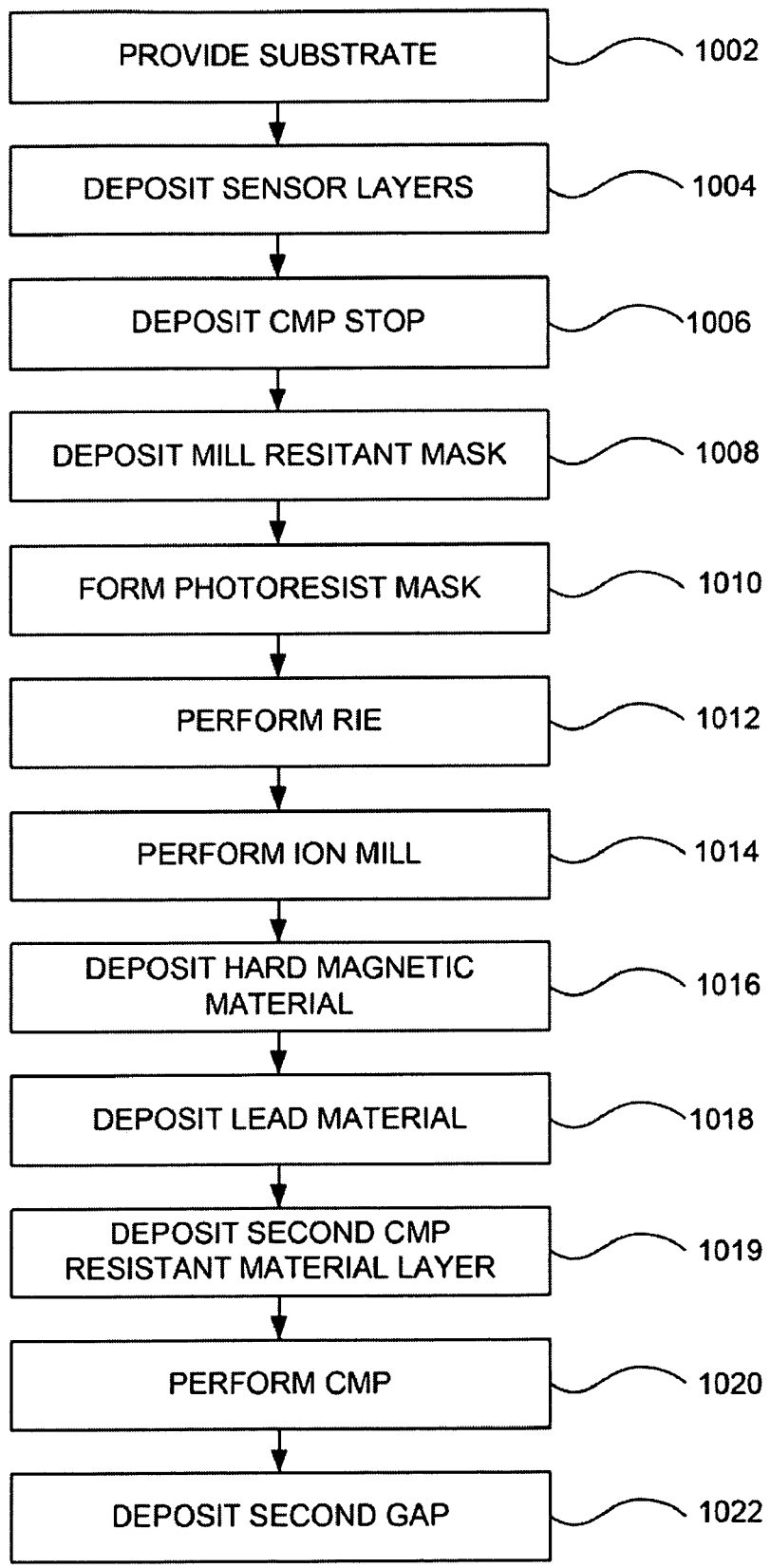
FIG. 10 is flowchart summarizing a method of manufacturing a magnetoresistive sensor according to an embodiment of the invention.

With reference to FIG. 10, a method for manufacturing a magnetoresistive sensor as described above will be summarized. In a step 1002 a substrate is provided. This substrate may be for example an alumina gap layer 504. Then, in a step, 1004, a series of sensor layers 502 are deposited full film. Thereafter, in a step 1006 a CMP stop layer 506 is deposited and in a step 1008 a mill resistant mask 508 layer is deposited. Then, in a step, 1010 a layer of photoresist material is spun on and is then photolithographically patterned to form a photoresist mask 510 covering a sensor area and leaving non-sensor areas uncovered. Thereafter, in a step 1012, a material removal process is performed, such as reactive ion etch (RIE). The RIE process 600 is performed with a relatively high platen power, or at least 70 W. The platen power may be from 70 W to 500 W and is preferably 250 W to 350 W or about 300 W. The RIE 600 results in a photoresist mask having a cone or domed shape, without any mushroom overhang.

With continued reference to FIG. 10, in a step 1014 an ion milling process 700 is performed to remove a desired amount of sensor material that is not covered by the mask 508 and CMP stop 506. The ion milling process 700 can be performed until a spacer layer 406 is reached so that the pinned layer 404 remains or can be performed sufficiently to remove a portion or all of the pinned layer 404, leaving the AFM layer 420 remaining.

Then, in a step 1016 a layer of hard magnetic material 802 is deposited, and in a step 1018 a layer of electrically conductive lead material 804 is deposited. In a step 1019 a second layer of CMP resistant material, such as diamond like carbon (DLC) is deposited. Then, in a step 1020 a chemical mechanical polishing process (CMP) is performed to remove the remaining mill resistant mask 508, and to planarize the lead material layers 804. An optional second reactive ion etch process (RIE) may be performed to remove the CMP stop mask 506. Then, in a step 1022 a layer of non-magnetic, electrically insulating material such as alumina may be deposited to form the gap layer 424.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetoresistive sensor, comprising:

providing a substrate;

depositing a plurality of sensor layers;

depositing a layer of material that is resistant to removal by chemical mechanical polishing (CMP stop layer);

depositing an ion mill resistant antireflective coating layer;

forming a photoresist mask on the antireflective coating layer;

performing a reactive ion etch (RIE) to remove portions of the ion mill resistant antireflective coating layer that are not covered by the photoresist mask, the RIE being performed in a plasma chamber having a platen, the performing the RIE further comprising applying DC bias produced by a platen power of at least 70 W;

performing an ion mill to remove a portion of the sensor layers; and terminating the ion mill process before all of the sensor materials have been removed.

2. A method as in claim 1, wherein the plurality of sensor layers includes a pinned layer, and wherein the ion mill is terminated prior to removal of the pinned layer.

3. A method as in claim 1, wherein the plurality of sensor layers includes a pinned layer, and wherein the ion mill is terminated after a portion of the pinned layer has been removed, but prior to removal of all of the pinned layer.

4. A method as in claim 1, wherein the platen power applied to the platen is between 70 W and 500 W.

5. A method as in claim 1 wherein the platen power applied to the platen is between 250 W and 350 W.

6. A method as in claim 1 wherein the platen power applied to the platen is about 300 W.

7. A method as in claim 1 wherein the RIE is performed in a plasma chamber containing an $O_2$ atmosphere.

8. A method as in claim 1 wherein the plurality of sensor layers includes a pinned layer and an AFM layer, and wherein the ion mill is performed sufficiently to remove the pinned layer, but is terminated before removing the AFM layer.

9. A method as in claim 1 wherein the plurality of sensor layers includes a pinned layer structure, a spacer layer comprising Cu formed over the pinned layer structure and a magnetic free layer structure formed over the spacer layer, and wherein Cu detection is used to terminate the ion mill when the spacer layer has been reached.

* * * * *